(12) United States Patent
Farnworth

(10) Patent No.: US 6,395,566 B2
(45) Date of Patent: *May 28, 2002

(54) METHOD OF WIRE-BONDING A REPAIR DIE IN A MULTI-CHIP MODULE USING A REPAIR SOLUTION GENERATED DURING TESTING OF THE MODULE

(75) Inventor: Warren M. Farnworth, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/867,374

(22) Filed: May 29, 2001

Related U.S. Application Data

(63) Continuation of application No. 09/056,408, filed on Apr. 7, 1998, now Pat. No. 6,238,942.

(51) Int. Cl.⁷ .............................................. H01L 21/66
(52) U.S. Cl. ............................ 438/15; 438/17; 438/18; 438/109
(58) Field of Search ............................... 438/4, 14, 15, 438/17, 18, 106, 107, 109; 257/48; 29/593, 827

(56) References Cited

U.S. PATENT DOCUMENTS

| | | | |
|---|---|---|---|
| 5,137,836 A | 8/1992 | Lam | 438/15 |
| 5,539,752 A | 7/1996 | Berezin et al. | 371/22.1 |
| 5,796,746 A | 8/1998 | Farnworth et al. | 371/21.1 |
| 5,807,762 A | 9/1998 | Akram et al. | 438/15 |
| 5,817,535 A | 10/1998 | Akram | 438/15 |
| 5,844,803 A | 12/1998 | Beffa | 364/464.28 |
| 5,856,923 A | 1/1999 | Jones et al. | 364/468.28 |
| 5,907,492 A | 5/1999 | Akram et al. | 364/468.28 |
| 5,915,231 A | 6/1999 | Beffa | 702/118 |
| 5,927,512 A | 7/1999 | Beffa | 209/573 |
| 6,067,507 A | 5/2000 | Beffa | 702/118 |
| 6,238,942 B1 * | 5/2001 | Farnworth | 438/15 |
| 6,329,832 B1 * | 12/2001 | Cobbley et al. | 324/765 |

FOREIGN PATENT DOCUMENTS

| | | |
|---|---|---|
| JP | 5-074909 | 3/1993 |
| JP | 5-121496 | 5/1993 |
| JP | 6-310581 | 11/1994 |

OTHER PUBLICATIONS

Micron "Dram Data Book"— Cover p. & pp. 8–8, 8–9 (1995).

* cited by examiner

Primary Examiner—Douglas Wille
Assistant Examiner—Alonzo Chambliss
(74) Attorney, Agent, or Firm—TraskBritt

(57) ABSTRACT

A multi-chip module (MCM) that fails testing after its assembly is repaired by generating a wire-bonding solution for a repair die during testing, storing the repair solution in a computer system in association with a unique ID code read from the MCM, and then using the repair solution at a wire-bonding station to correctly bond out a repair die for the MCM. The use of a stored repair solution at the wire-bonding station eliminates the need for a human operator to manually select the repair solution, and thus reduces the opportunity for error while shortening the length of time it takes to complete the repair process.

16 Claims, 4 Drawing Sheets

METHOD OF WIRE-BONDING A REPAIR DIE IN A MULTI-CHIP MODULE USING A REPAIR SOLUTION GENERATED DURING TESTING OF THE MODULE

CROSS-REFERENCE TO RELATED APPLICATION

This application is a continuation of application Ser. No. 09/056,408, filed Apr. 7, 1998, now U.S. Pat. No. 6,238,942, issued May 29, 2001.

BACKGROUND OF THE INVENTION

1. Technical Field

This invention relates in general to multi-chip modules and, more specifically, to methods for repairing such modules by bonding out a module repair site using a repair solution generated during module testing.

2. State of the Art

As shown in FIG. 1, multi-chip modules (MCMs), comprising multiple dice carried on a printed circuit board (PCB) or other carrier substrate bearing circuit traces, are generally tested after being assembled, and those MCMs that pass testing are then shipped to customers. Those MCMs that fail testing are marked as such, typically by printing an "X" on the top of the "bad" (i.e., at least partially defective) dice that caused each MCM to fail testing. After being marked, any bad dice on a given MCM are disabled through various means including, for example, cutting conductive traces on the MCM to isolate the bad dice, or shorting conductive traces together to force a high-impedance condition on all inputs and outputs of the bad dice (e.g., by pulling the RAS* input of a Dynamic Random Access Memory (DRAM) permanently high).

Once the bad dice are disabled, known-good die (KGD) repair dice are attached to each failing MCM at an empty repair site. The failing MCMs with attached repair dice then proceed to a wire-bonding station, where an operator manually selects the wire-bonding pattern (also referred to as a wire-bonding "solution" herein) necessary to connect the repair dice to traces on the carrier substrate to replace the disabled bad dice. The repair dice are wire-bonded using the manually selected wire-bonding solution, and the repaired MCMs are then retested, with those repaired MCMs that pass the retesting proceeding on to shipping, and those repaired MCMs that fail retesting proceeding once again to repair or, alternatively, to scrap.

Because a wire-bonding machine operator manually selects a particular wire-bonding pattern for each MCM to be repaired, the process of repairing MCMs is subject to human error. Specifically, the operator generally selects the particular wire-bonding pattern to be used based on which dice are marked as bad (e.g., with the "X" described above), so the operator may make a mistake in observing which dice are marked as bad, or in selecting the appropriate wire-bonding pattern, or both.

Therefore, there is a need in the art for a method of selecting a wire-bonding solution for a MCM to be repaired that avoids the chance for human error associated with the conventional method described above.

SUMMARY OF THE INVENTION

In one embodiment of this invention, a multi-chip module (MCM) proceeds to testing after it is assembled. During testing, an ID code (e.g., a bar code) of the MCM is read. Then, if the MCM fails testing, a wire-bonding repair solution is generated and stored in a computer system in association with the ID code. The wire-bonding repair solution may identify, for example, which of several sets of bonding pads on the surface of a substrate of the MCM a repair integrated circuit (IC) die or dice should be wire-bonded to. A bad IC die or dice of the MCM that caused the MCM to fail testing may then be disabled by, for example, disconnecting the bad IC die or dice from the rest of the MCM, or by permanently connecting the bad IC die or dice so all of its inputs and outputs are in a high-impedance state. The repair IC die or dice is then attached to the substrate of the MCM, the stored repair solution is accessed, and the repair IC die or dice is wire-bonded to the substrate in accordance with the accessed repair solution. As a result, the opportunity for human error is avoided, and the length of time it takes to repair the MCM is shortened.

DETAILED DESCRIPTION OF THE ILLUSTRATED EMBODIMENTS

Figure 1:
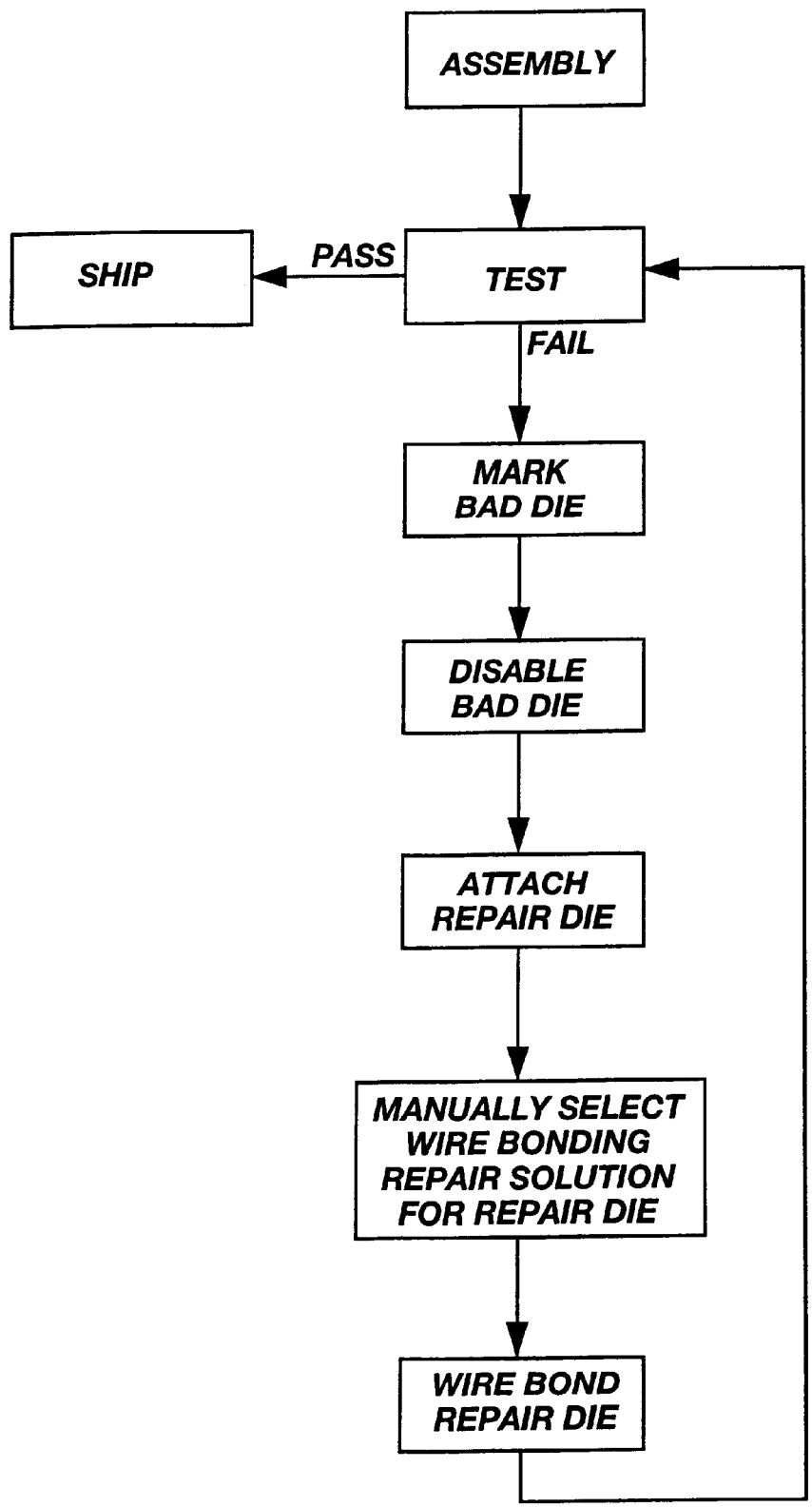
FIG. 1 is a flow diagram illustrating a conventional method for wire-bonding a repair die in a multi-chip module (MCM)
Figure 2:
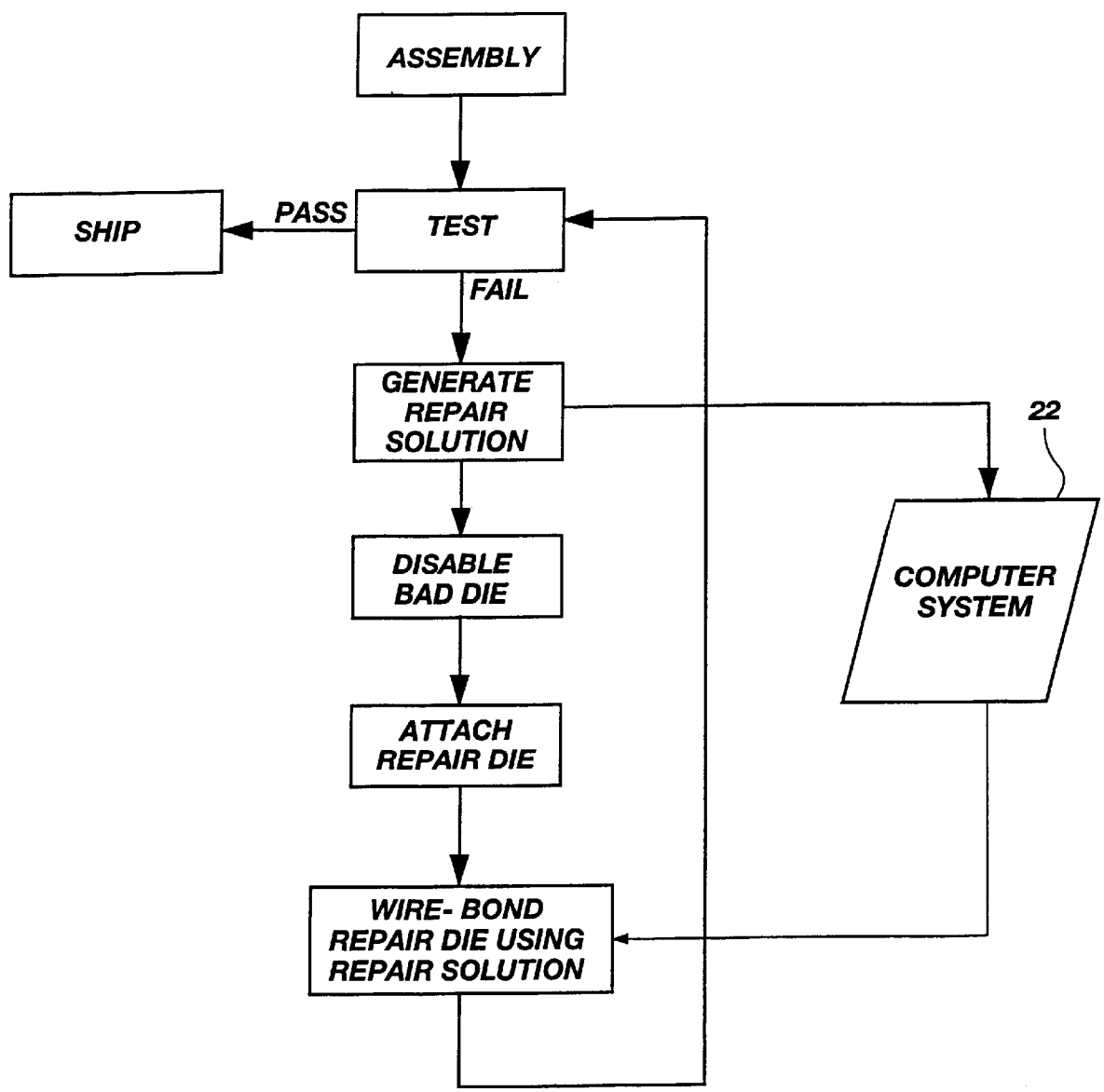
FIG. 2 is a flow diagram illustrating a method in accordance with this invention for wire-bonding a repair die in a MCM.
Figure 3:
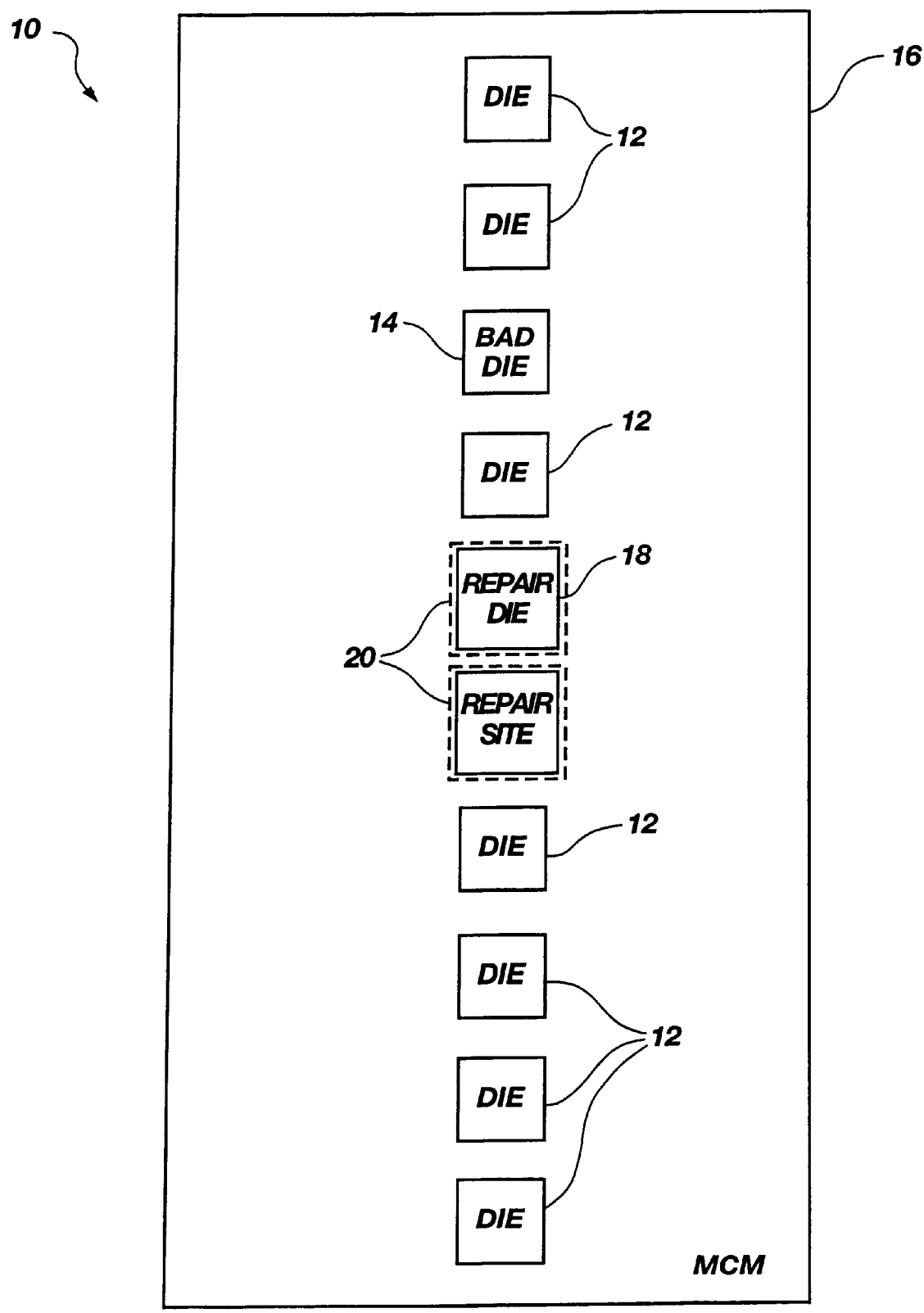
FIG. 3 is a top view of a MCM illustrating the arrangement of repair sites on the MCM.

As shown in FIGS. 2 and 3, the manufacture of a multi-chip module (MCM) 10 using the principles of this invention begins in assembly, where integrated circuit (IC) dice 12 and 14 are attached to a printed circuit board (PCB) 16 or other carrier substrate and are then wire-bonded to conductive traces 32 (FIG. 4) on the surface of the PCB 16.

It will be understood by those having skill in the technical field of this invention that the invention is applicable to any MCM including, for example, Dynamic Random Access Memory (DRAM), Single In-Line Memory Modules (SIMMs) and Dual In-Line Memory Modules (DIMMs). Also, it will be understood that this invention is applicable to any IC dice including, for example, DRAM dice, SRAM dice, Synchronous DRAM (SDRAM) dice, Sync-Link DRAM (SLDRAM) dice, processor dice (e.g., Intel Corp.'s Pentium® and Pentium II® chips), Extended Data-Out DRAM (EDO DRAM) dice, and flash Erasable Electrically Programmable Read Only Memory (EEPROM) dice.

After assembly, the MCM 10 proceeds to testing. If the MCM 10 passes testing, it is generally ready for shipping to customers. If, instead, it fails because of a bad die 14, a wire-bonding repair solution is generated during testing that will later allow a repair die 18 positioned at one of two repair sites 20 to be wire-bonded such that it replaces the bad die 14. Specifically, this repair solution may identify, for example, which one of multiple sets of pads 30 (see FIG. 4) on the PCB 16 the repair die 18 should be wire-bonded to in order for it to replace the identified bad die 14 (i.e., one set of pads connects the repair die 18 to replace the bad die 14, while the other sets of pads can connect the repair die 18 to replace other dice 12 if they are bad). The repair solution is stored in a computer system 22 in association with a unique identification (ID) code of the MCM 10 read during testing. This ID code may be, for example, a bar code, an Optical Character Recognition (OCR) code, an optically readable punch hole code, or an electronically readable laser fuse code embedded in the PCB 16.

Once the repair solution is generated, the MCM 10 moves on to a rework station, where the bad die 14 is isolated or disabled by cutting conductive traces 32 (FIG. 4) on the PCB 16 connected to the bad die 14, or by shorting such conductive traces together in order to bring all inputs and outputs of the bad die 14 to a high-impedance state (e.g., by pulling the RAS* input of a DRAM permanently high).

After the rework station, the MCM 10 moves to a die attach station, where the repair die 18 is attached at the repair site 20 shown in FIG. 3. The particular repair site 20 used, as shown in FIG. 3, is dedicated to repairing any bad dice among the four dice 12 (including the bad die 14) shown at the top of the MCM 10 in FIG. 3, while the other repair site 20 is dedicated to repairing any bad dice among the four dice 12 shown at the bottom of the MCM 10 in FIG. 3. Of course, it will be understood that this invention is not restricted to the configuration of repair sites and dice shown in FIG. 3. Rather, this invention includes within its scope MCMs having more or less than the eight dice shown in FIG. 3, and having more or less than the two repair sites shown in FIG. 3.

Once the repair die 18 is attached, the MCM 10 moves to a wire-bonding station. There, a wire-bonding machine reads the unique ID code of the MCM 10, accesses the repair solution stored in the computer system 22 in association with this ID code, and wire bonds the repair die 18 accordingly. As a result, the opportunity for human error in selecting the appropriate repair solution is minimized or eliminated.

Figure 4:
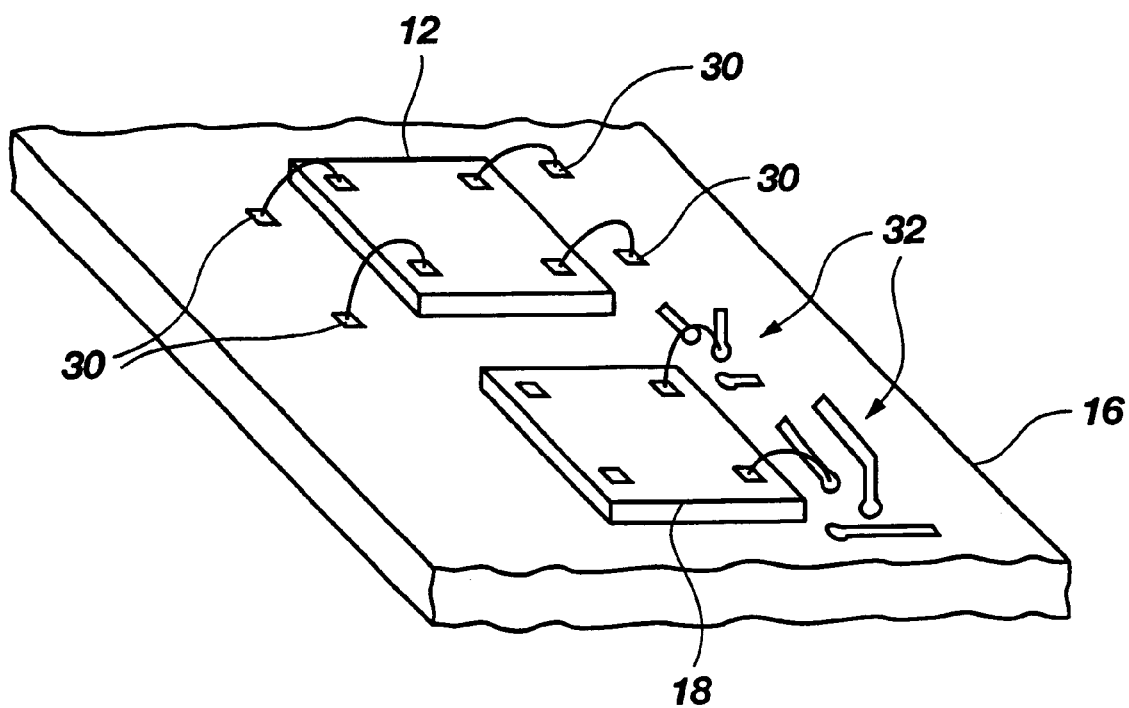
FIG. 4 is an isometric view showing the MCM of FIG. 3 in more detail.

As shown in FIG. 4, the die 12 is wire-bonded to bond pads 30 on the surface of the PCB 16, while the repair die 18 is wire-bonded to one of multiple sets of bond pads and conductive traces 32 on the same surface.

Although the present invention has been described with reference to a particular embodiment, the invention is not limited to this embodiment. For example, while the various steps of this embodiment have been described as occurring in a particular order, it will be understood that these steps need not necessarily occur in the described order to fall within the scope of the present invention. Thus, the invention is limited only by the appended claims, which include within their scope all equivalent methods that operate according to the principles of the invention as described.

I claim:

1. A method of making a multichip module (MCM), the method comprising:
   assembling the MCM, including attaching and wire-bonding a plurality of integrated circuit (IC) dice to a carrier substrate;
   reading an identification (ID) code associated with the MCM;
   electrically testing each of the plurality of IC dice of the MCM;
   if at least one of the IC dice of the plurality fails the testing, generating a wire-bonding repair solution for the MCM responsive to results of the testing and storing the generated wire-bonding repair solution in association with the ID code associated with the MCM;
   disabling the at least one failing IC die;
   attaching at least one repair IC die to the carrier substrate of the MCM;
   rereading the ID code associated with the MCM;
   accessing the stored wire-bonding repair solution; and
   wire-bonding the at least one repair IC die to the carrier substrate in accordance with the accessed wire-bonding repair solution.

2. The method of claim 1 wherein assembling the MCM includes assembling a MCM selected from the group comprising a Single In-Line Memory Module (SIMM) and a Dual In-Line Memory Module (DIMM).

3. The method of claim 1 wherein assembling the MCM includes attaching and wire-bonding the IC dice to the carrier substrate comprising a printed circuit board (PCB).

4. The method of claim 1 wherein reading the ID code comprises reading an ID code selected from the group comprising a bar code, an Optical Character Recognition (OCR) code, an optically readable punch hole code, or an electronically readable laser fuse code embedded in the carrier substrate of the MCM.

5. The method of claim 1 wherein generating the wire-bonding repair solution comprises generating a repair solution that indicates to which of several sets of bonding pads on a surface of the carrier substrate of the MCM the at least one repair IC die should be wire-bonded.

6. The method of claim 1 wherein storing the wire-bonding repair solution comprises storing the wire-bonding repair solution in a computer system in association with the ID code of the MCM.

7. The method of claim 1 wherein disabling the at least one failing IC die includes at least one of the following acts: electrically disconnecting the at least one failing IC die from the MCM and causing all inputs and outputs of the at least one failing IC die to enter a high-impedance state.

8. A method of making a multichip module (MCM), the method comprising:
   assembling the MCM including attaching and wire-bonding a plurality of integrated circuit (IC) dice to a carrier substrate;
   electrically testing the MCM, wherein:
      if the MCM fails the testing because of at least one defective integrated circuit (IC) die, generating a wire-bonding repair solution responsive to results of the testing, storing the generated wire-bonding repair solution for the MCM and disabling the at least one defective integrated circuit (IC) die;
   attaching at least one repair IC die to the MCM;
   accessing the stored wire-bonding repair solution; and
   wire-bonding the at least one repair IC die to the carrier substrate in accordance with the accessed stored wire-bonding repair solution.

9. The method of claim 8 wherein assembling the MCM includes assembling a MCM selected from the group comprising a Single In-Line Memory Module (SIMM) and a Dual In-Line Memory Module (DIMM).

10. The method of claim 8 wherein assembling the MCM includes attaching IC dice to the carrier substrate comprising a printed circuit board (PCB).

11. The method of claim 8 wherein generating the wire-bonding repair solution comprises generating a repair solution that indicates to which of several sets of bonding pads on a surface of a substrate of the MCM the at least one repair IC die should be wire-bonded.

12. The method of claim 8 wherein storing the wire-bonding repair solution comprises storing the wire-bonding repair solution in a computer system.

13. A method of repairing a multichip module (MCM) including at least one defective integrated circuit (IC) die, the method comprising:
   generating and storing a wire-bonding repair solution for the MCM;
   disabling the at least one defective IC die;
   attaching at least one repair IC die to the MCM;
   accessing the stored wire-bonding repair solution; and
   wire-bonding the at least one repair IC die in accordance with the accessed stored wire-bonding repair solution.

14. The method of claim 13 wherein storing the wire-bonding repair solution comprises storing the wire-bonding repair solution in a computer system.

15. The method of claim 13 wherein disabling the at least one defective IC die includes at least one of the following acts:
   electrically disconnecting the defective IC die from the rest of the MCM and causing all inputs and outputs of the defective IC die to enter a high-impedance state.

16. The method of claim 13 wherein generating the wire-bonding repair solution comprises generating a repair solution that indicates to which of several sets of bonding pads on a surface of a substrate of the MCM the at least one repair IC die should be wire-bonded.

* * * * *

UNITED STATES PATENT AND TRADEMARK OFFICE
CERTIFICATE OF CORRECTION

| | | |
|---|---|---|
| PATENT NO. | : 6,395,566 B2 | Page 1 of 1 |
| APPLICATION NO. | : 09/867374 | |
| DATED | : May 28, 2002 | |
| INVENTOR(S) | : Warren M. Farnworth | |

It is certified that error appears in the above-identified patent and that said Letters Patent is hereby corrected as shown below:

On the title page:
In item (56) References Cited, U.S.
  Patent Documents, 3$^{rd}$ entry,            change "Farnsworth et al." to
                                                           --Farnworth et al.--

In the claims:
CLAIM 15,    COLUMN 6,      LINES 4-5,      delete "the rest of"

Signed and Sealed this

Fifth Day of June, 2007

JON W. DUDAS
*Director of the United States Patent and Trademark Office*